United States Patent [19]
Walters

[11] Patent Number: 5,164,615
[45] Date of Patent: Nov. 17, 1992

[54] METHOD AND APPARATUS FOR ZERO TEMPERATURE COEFFICIENT REFERENCE VOLTAGE DEVICES

[75] Inventor: Cecil K. Walters, Scottsdale, Ariz.

[73] Assignee: Microsemi Corp., Scottsdale, Ariz.

[21] Appl. No.: 709,320

[22] Filed: Jun. 3, 1991

[51] Int. Cl.⁵ .................. H03K 3/26; H03K 19/08
[52] U.S. Cl. .................. 307/317.2; 307/308; 307/318; 307/310
[58] Field of Search .............. 307/317.2, 318, 310, 307/308; 357/15

[56] References Cited

U.S. PATENT DOCUMENTS

| | | | |
|---|---|---|---|
| 3,780,322 | 12/1973 | Walters | 307/318 |
| 4,249,091 | 2/1981 | Yamagiwa | 307/317.2 |
| 4,300,149 | 11/1981 | Howard et al. | 357/15 |
| 4,403,399 | 9/1983 | Taylor | 357/13 |
| 4,948,989 | 9/1990 | Spratt | 307/318 |

Primary Examiner—Janice A. Howell
Assistant Examiner—Sinh Tran
Attorney, Agent, or Firm—Antonio R. Durando; Harry M. Weiss

[57] ABSTRACT

A reference voltage device that consists of a series combination of reverse biased p-n junctions, forward biased p-n junctions, and Schottky hot carrier diodes. The relatively low voltage and low negative temperature coefficient of Schottky diodes permit great flexibility in correcting areas of nonlinearity in the offsetting temperature dependent characteristics of conventional forward biased junctions and zener diodes. Because of the stability of Schottky hot carrier diodes to radiation, the method and apparatus of this invention are particularly suitable for designing radiation hardened reference diodes, as well. Finally, the Schottky forward biased diode is suitable for integration into a single monolithic chip structure in series with conventional reverse and forward biased p-n junctions.

16 Claims, 3 Drawing Sheets

METHOD AND APPARATUS FOR ZERO TEMPERATURE COEFFICIENT REFERENCE VOLTAGE DEVICES

BACKGROUND OF THE INVENTION

1. Field of the Invention

This invention pertains to the general field of voltage reference apparatus. In particular, it provides a new method for manufacturing a reference diode device with a near-zero temperature coefficient utilizing the unique characteristics of Schottky hot-carrier diodes.

2. Description of the Prior Art

The general purpose of reference devices is to provide a voltage reference that exhibits very little change in voltage over a broad range of operating temperatures. Even though the temperature dependence of diode characteristics tends to be linear for limited ranges, diode currents and terminal voltages are affected in nonlinear fashion by temperature variations over their overall normal range of use. Therefore, compensation for temperature dependence by combination of components with offsetting characteristics is difficult and limited to relatively small ranges.

In general, when a diode is operated in the forward direction, an increase in temperature results in a decrease in its forward threshold voltage. Within relatively small temperature changes, this relationship is inversely linear and can be usefully expressed by the following empirical equation:

$$V_F(T_1) - V_F(T_0) = -k(T_1 - T_0)$$

where $V_F$ is the diode terminal threshold voltage (forward voltage); $T_0$ and $T_1$ correspond to standard room temperature (25° C.) and to the diode operating temperature, respectively; and k is the diode's temperature coefficient. This equation applies at constant diode current. See Schilling, Donald L. and Charles Belove, "Electronic Circuits, Discrete and Integrated," Second Edition, McGraw-Hill Book Company, New york, N. Y., pages 54–60. In practice, a typical temperature coefficient for a silicon diode is approximately 2 mV/° C. Thus, for example, the typical silicon diode voltage of 0.7 V at 25° C. and 1.0 mA of current decreases to 0.5 V if the temperature is raised to 125° C. Similarly, a temperature decrease to −75° C. would produce a diode voltage of about 0.9 V at 1 mA.

On the other hand, when a diode is used as a zener in reverse bias mode, the change of the zener (breakdown) voltage $V_Z$ as a result of temperature fluctuations within a relatively limited range is directly proportional to the temperature change. This direct relationship is also usually expressed in terms of a temperature coefficient k, as follows:

$$k = (\Delta V_Z / V_Z) / \Delta T$$

where $V_Z$ is the zener voltage and T is the diode's temperature. In practice, a typical temperature coefficient in the higher nominal zener range of operation is approximately 0.1 percent; that is, the zener voltage increases by 0.001 $V_Z$ for each 1° C. of temperature rise. This coefficient value declines when using lower nominal zener voltages and actually becomes negative as field emission (tunnelling) becomes predominant over avalanche breakdown mechanisms.

Prior art techniques have exploited the positive temperature coefficient of reversed-biased p-n junctions combined in series with the negative temperature coefficient of forward-biased p-n junctions to produce a nearly constant net voltage across the combination. By properly selecting each component of the combination, a near-zero temperature coefficient of voltage change can be achieved over their linear range of operation by connecting them in series. To the extent that the temperature response of the individual components is nonlinear, though, such series configurations retain nonideal temperature coefficients characteristics.

U.S. Pat. No. 3,780,322 to Walters (1973) discloses an improved voltage reference device consisting of a series combination of forward and reverse biased p-n junctions with bulk semiconductive material. The resistance of the bulk material, which also changes with temperature, is used to compensate for the change of the voltage standard with temperature and is selected to produce a reference device with minimal voltage versus temperature deviation. Thus, this technique introduces a significant amount of undesirable dynamic impedance in the device.

Therefore, there still exists a need for an improved reference voltage device that exhibits a near zero temperature coefficient over a wide range of operating conditions. The method and apparatus described herein are directed at attaining this result by utilizing specific and unique characteristics of forward-biased Schottky hot carrier diodes, which afford a level of design flexibility not found in prior art series combinations of forward and reverse biased junctions.

BRIEF SUMMARY OF THE INVENTION

It is therefore an important objective of this invention to provide a reference voltage device that exhibits a near-zero temperature coefficient over a wide range of operating conditions.

Another objective of the invention is that it provide a method for constructing reference voltage devices which affords great flexibility for achieving the desired level of performance within a given temperature range by manipulating the characteristics of each component.

Another goal of the invention is that the resulting reference voltage device be stable when subjected to radiation.

Another objective of this invention is that the reference voltage device be suitable for monolithic implementation on a semiconductor substrate.

A further objective of the invention is the ability to apply the same general concept in a variety of designs and physical embodiments to fit the various implementation processes currently known in the art. To that end, the apparatus described herein can be implemented in alternative configurations obvious to one skilled in the art by the use of any compatible combination of known semiconductor devices.

Yet another objective of this invention is the realization of the above mentioned goals in an economical and commercially viable manner. This is done by utilizing simple components and methods of manufacture that are either already available in the open market or can be developed at competitive prices.

In accordance with these and other objectives, the reference voltage device of this invention consists of a series combination of reverse biased p-n junctions, forward biased p-n junctions, and Schottky hot carrier diodes. The relatively low voltage and low negative temperature coefficient of Schottky diodes permit great flexibility in correcting areas of nonlinearity in the offsetting temperature dependent characteristics of conventional forward biased junctions and zener diodes. In addition, because of the stability of Schottky hot carrier diodes to radiation, the method and apparatus of this invention are particularly suitable for designing radiation hardened reference diodes. Finally, the Schottky forward biased diode can be integrated into a single monolithic chip structure in series with conventional reverse and forward biased p-n junctions.

Various other purposes and advantages of the invention will become clear from its description in the specifications that follow, and from the novel features particularly pointed out in the appended claims. Therefore, to the accomplishment of the objectives described above, this invention consists of the features hereinafter illustrated in the drawings, fully described in the detailed description of the preferred embodiment and particularly pointed out in the claims. However, such drawings and description disclose but one of the various ways in which the invention may be practiced.

DETAILED DESCRIPTION OF THE INVENTION

The heart of this invention lies in the recognition that the unique properties of Schottky hot carrier diodes can be utilized to correct some of the imperfections of conventional reference voltage devices. Schottky diodes, which consist of a metal, such as platinum, acting as an acceptor material when bonded to n-type silicon, have characteristics similar to those of ordinary p-n silicon junctions, but with a lower forward break voltage (approximately 0.3 V). In addition, Schottky hot carriers have a lower negative temperature coefficient (approximately 1.5 mV/° C., compared to 2.0 mV/° C.) and show very little forward biased voltage change in environments subject to radiation. This is a result of the fact that they operate on a majority carrier principle, as opposed to the minority carrier functioning of forward biased p-n junctions. Since various forms of irradiation affect the formation of recombination centers in the semiconductor lattice, on which minority carrier functioning is dependent, radiation dependence is much greater for forward biased p-n junctions than for hot carrier diodes. Therefore, this difference in operational characteristics and performance can be exploited to design radiation hardened reference diodes by utilizing Schottky diodes in combination with current state-of-the-art methods.

Figure 1:
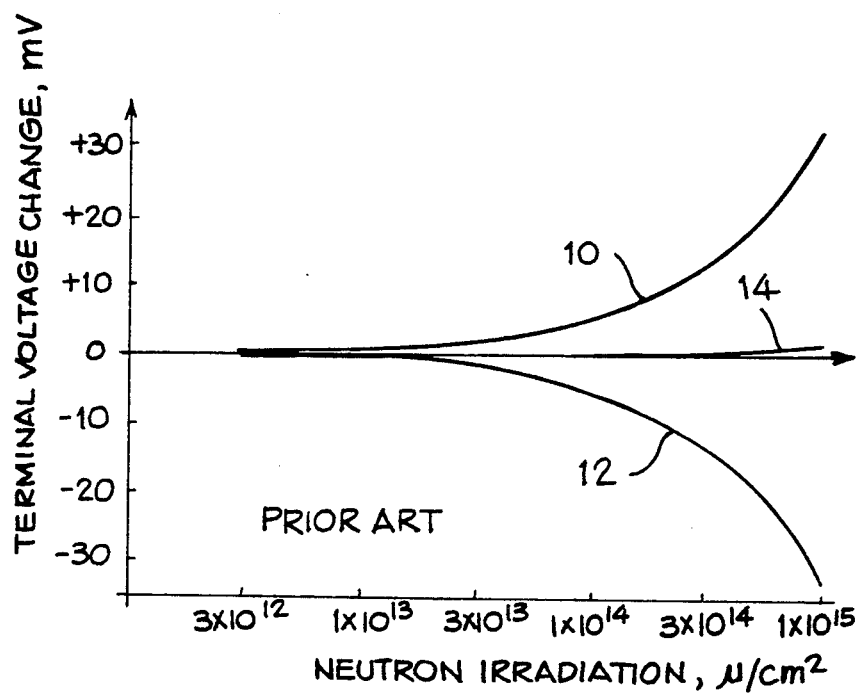
FIG. 1 is a graph illustrating the typical effects of radiation on the terminal voltages of reverse biased p-n junctions, forward biased p-n junctions, and Schottky diodes.

Referring to the drawings, wherein like parts are designated throughout with like numerals and symbols, FIG. 1 illustrates the typical radiation effect on the terminal voltages of zener and forward biased p-n junctions. The figure shows the terminal voltage change ($\Delta V_T$) of each component from its nominal value as a function of the density of neutron irradiation to which it is subjected. It is clear from curve 10 in the graph that the voltage change of the zener diode with increased radiation is positive (especially when the zener remains in avalanche breakdown), while the voltage change of forward biased p-n junctions is negative (curve 12). Thus, by combining the two to produce a reference device with minimal temperature dependence, a radiation hardened device is also obtained, inasmuch as the individual components are placed in series and the cumulative addition of their voltage changes produces a net near-zero effect. This result can be optimized by judicious selection of each component to minimize both the temperature coefficient and the radiation coefficient. FIG. 1 also shows the typical radiation dependence of the terminal voltage of a Schottky diode to illustrate its relatively small change with radiation (curve 14). It is apparent from the FIGURE that the hot carrier's positive radiation coefficient characteristics could not be utilized, alone, to offset either the negative characteristics of forward biased p-n junctions or the positive characteristics of reverse biased p-n junctions because of their relative small magnitude. However, a near-zero coefficient of voltage change with radiation can be achieved by carefully combining hot carrier Schottky diodes with zener and forward biased p-n junctions. As a result of the low radiation dependence of Schottky diodes, also these overall combinations exhibit reduced standard deviations in voltage response to radiation, resulting in more predictable behavior for the whole device. In essence, the Schottky diode can be used to produce a negative voltage change with temperature without any significant contribution to the overall voltage change in response to radiation.

Figure 2:
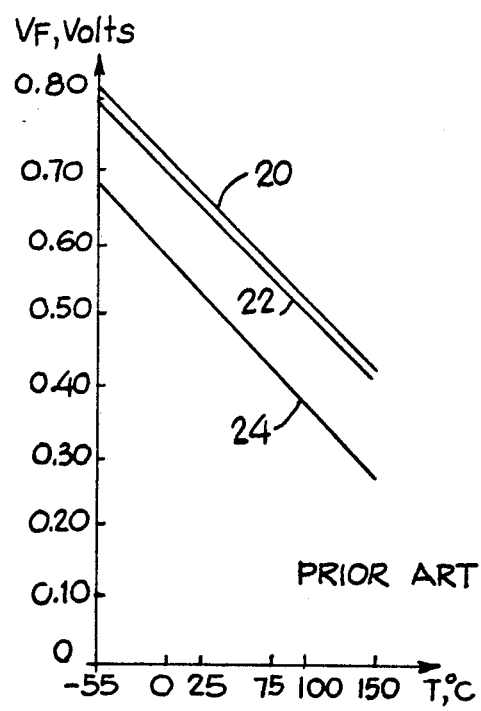
FIG. 2 illustrates the typical behavior of the terminal voltage of forward biased p-n junctions as a function of temperature.
Figure 3:
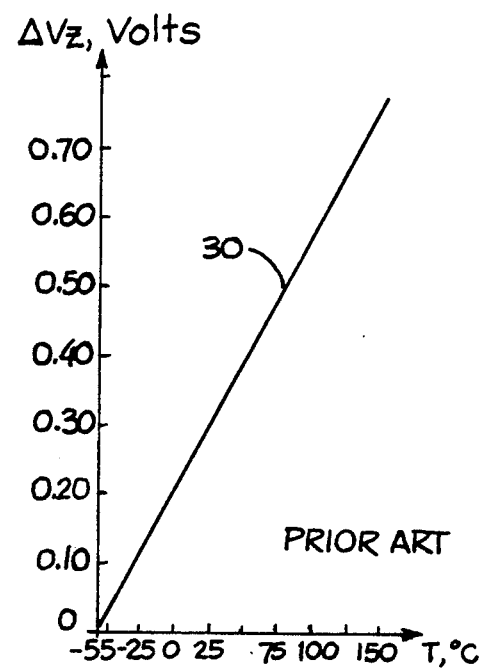
FIG. 3 illustrates the typical behavior of the terminal voltage of zener reverse biased p-n junctions as a function of temperature.
Figure 4:
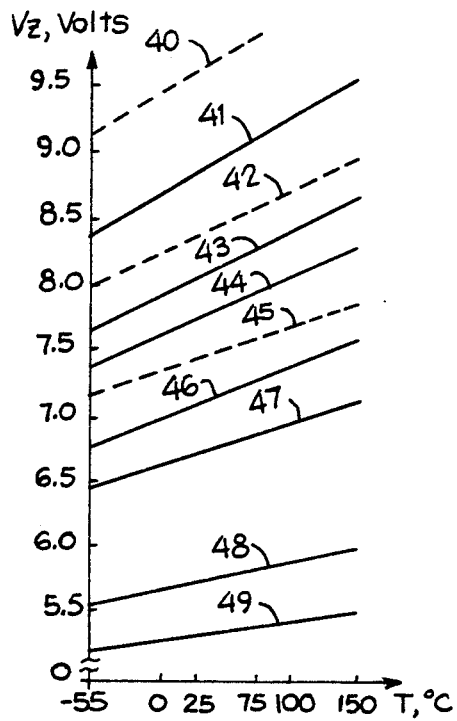
FIG. 4 illustrates the increasingly positive temperature coefficient of zener diodes as a function of reverse bias voltage.

FIGS. 2, 3 and 4 show the typical behavior of the terminal voltages of forward biased p-n junctions and zener diodes, respectively, as a function of temperature. Curves 20, 22 and 24 in FIG. 2 represent the forward voltage $V_F$ of three forward biased p-n junctions with different nominal voltages operating at 7.50 mA. The drawing illustrates the negative temperature coefficient of forward biased p-n junctions and the nearly linear dependence over the range of interest when the curves are graphed on a scale expressed in volts.

Similarly, FIGS. 3 and 4 illustrate the typical behavior of zener voltage with increasing temperature. Curve 30, expressed in terms of the temperature-dependent zener voltage change at 7.50 mA with respect to its nominal value at $-55°$ C., shows the normal positive temperature coefficient of reverse biased junctions and the nearly linear behavior over the common range of operation. Curves 40 through 49 illustrate the increase in the temperature coefficient of zener diodes as a function of increasing zener voltage for both abrupt (alloy) p-n junctions and graded (diffused) p-n junctions. The slope (i.e, the temperature coefficient, by definition) of the curves corresponding to each type of junction is shown to increase for greater zener voltages, $V_Z$. Note that the zener voltage change $\Delta V_Z$ and the zener voltage $V_Z$ are also expressed in volts. Therefore, these curves indicate an obvious opportunity to utilize the temperature dependence of forward biased p-n junctions to offset the temperature characteristics of zener diodes used to construct reference voltage devices.

Figure 5:
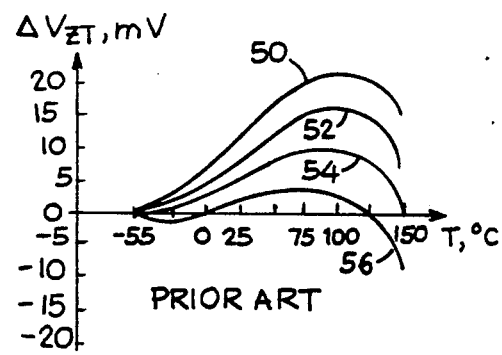
FIG. 5 is a graph illustrating the typical temperature dependence of prior art voltage reference devices using one alloy abrupt p-n junction zener and two or more forward biased p-n junctions, in composite series configuration.

FIG. 5 illustrates the typical result of combining a zener diode with forward biased p-n junctions in composite series configuration. These reference diodes typically experience a nonideal linear relationship of voltage change with temperature and commonly display a negative rate of change in the voltage curve slope with increasing temperature. The figure shows the change of the reference voltage $\Delta V_{ZT}$ of the series composite from its nominal value at $-55°$ C. as a function of temperature up to 150° C., which is the normal range of operation. Curves 50, 52, 54 and 56 show the effect of combining one zener diode in series with two or more forward biased p-n junctions. Obviously, the negative temperature coefficient of forward biased p-n junctions produces a greater negative rate of change in the voltage curve slope with temperature as more junctions are used to offset the positive temperature coefficient of the zener diode. Note that the ordinate scale in FIG. 5 is in millivolts, while the scale of FIGS. 2, 3 and 4 is expressed in volts, accounting for a greater definition of the nonlinearities in the curves.

Figure 6:
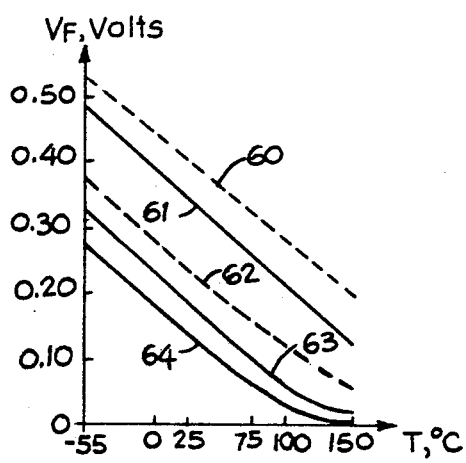
FIG. 6 illustrates the typical behavior of the terminal voltage of Schottky diodes as a function of temperature.

This invention concerns the exploitation of the characteristics of Schottky diodes to improve the performance illustrated in FIG. 5. As shown in FIG. 6, the typical temperature dependence of the forward voltage $V_F$ of Schottky diodes is generally linear with a negative temperature coefficient, but it becomes increasingly nonlinear as the forward voltage approaches zero. Since the forward voltage of Schottky diodes depends on the barrier metals and the type of doping used, a notable nonlinear temperature response in the typical range of interest can be purposefully introduced. This nonlinear region is initially seen at the high end of the temperature range where the forward voltage is close to zero, but it can be enhanced and shifted by design selection of the Schottky diode metal and doping. Thus, for example, the two sets of curves (60, 62) and (61, 63, 64) correspond to sets of Schottky diodes with platinum-tungsten and tungsten metal barrier and with progressively decreasing starting substrate resistivity operating at 7.50 and 1.00 mA, respectively. It can be seen that varying the substrate resistivity from 1.00 ohm/cm (curve 61) to 0.25 ohm/cm (curve 63), the nominal voltage is reduced and some nonlinearity is introduced at the end of the temperature range (where $V_F$ becomes small). By further reducing the starting substrate resistivity to 0.03 ohm/cm (curve 64), the forward-biased voltage behavior becomes nonlinear as it approaches zero and the curvature is shifted to a lower temperature. The same trend is shown by curves 60 and 62 for 1.00 and 0.25 ohm/cm resistivity at 7.50 mA. Thus, while in general the forward biased voltage temperature relationship is primarily influenced by current density only, the substrate resistivity and barrier metal become factors when the voltage approaches zero and the junction starts performing like an ohmic contact.

It is therefore apparent that the starting substrate resistivity, the current density of operation, and barrier metal selection can be used to manipulate the forward voltage value as well as the voltage temperature relationship of Schottky diodes to produce desirable characteristics for offsetting nonlinearities in the temperature dependence of prior art reference voltage devices. By introducing an offsetting amount of this optional nonlinear design feature of the Schottky diode, specific nonlinear features of the overall reference diode typically experienced in prior art (see FIG. 5) can be minimized. If the Schottky diode nonlinearity is designed by process manipulation for the required offsetting characteristics, an optimum near-zero temperature coefficient composite structure can be achieved for reference voltage devices. Since the Schottky diode can be selected with a positive rate of change of slope (see FIG. 6), the resultant series combination of a zener with an optional forward biased p-n junction and one or more Schottky forward biased junctions can minimize the magnitude of the overall composite nonlinearity.

Figure 7:
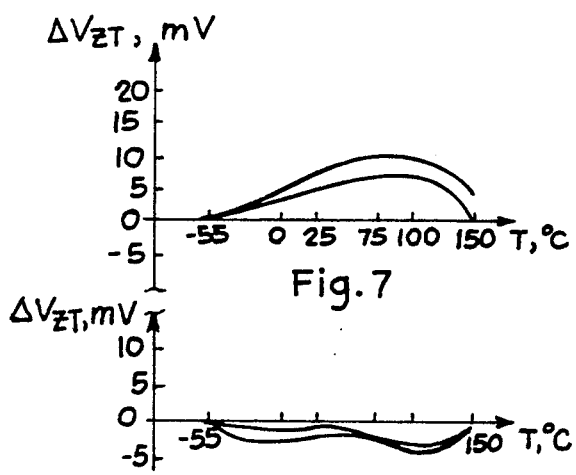
FIGS. 7 and 8 show the temperature performance characteristics of two composite voltage reference devices, each including one alloy zener p-n junction, one forward biased p-n junction, and one Schottky junction in series configuration.
Figure 8:
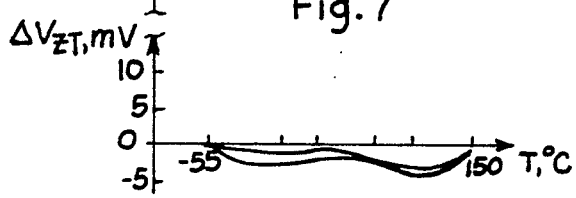

Referring to FIGS. 7 and 8, the change in reference voltage, $\Delta V_{ZT}$, from the nominal value of approximately 8.05 volts as a function of temperature is shown for two composite series configurations including one alloy zener step p-n junction, one forward biased p-n junction, and one Schottky junction. By judicious selection of the Schottky nonlinearity features illustrated in FIG. 6, the voltage change over the temperature range (from $-55°$ C. to $+150°$ C.) in FIG. 8 is reduced to approximately one half that of FIG. 7 and it is reasonable to assume that further improvements can be achieved by specific optimization design beyond the research work illustrated here.

The only prior art technology known for specifically minimizing nonlinear features of reference diodes involves the use of parasitic bulk semiconductor material, as disclosed in the above referenced U.S. Pat. No. 3,780,322. That method, though, unavoidably depends on the introduction of significant dynamic impedance in order to reduce voltage changes over the operating temperature range. Such added dynamic impedance is undesirable because small operating current changes through the reference diode result in added voltage change, which is contrary to the objective sought. In contrast, the use of Schottky diodes to minimize voltage changes over the operating temperature range of interest is achievable with minimal dynamic impedance at the typical operating test currents of 0.50 to 10.0 mA. The forward biased Schottky junction generally exhibits a comparatively low dynamic impedance, corresponding to a voltage drop on the order of 2.7 mV with a 10% modulation over such test currents. By comparison, conventional forward biased p-n junctions typically portray a dynamic impedance corresponding to 3.0 to 6.0 mV, depending on the resistivity of the material used. Therefore, the Schottky method of minimizing the nonlinear voltage changes of reference diodes also reduces the effect on dynamic impedance.

Figures 9, 10:
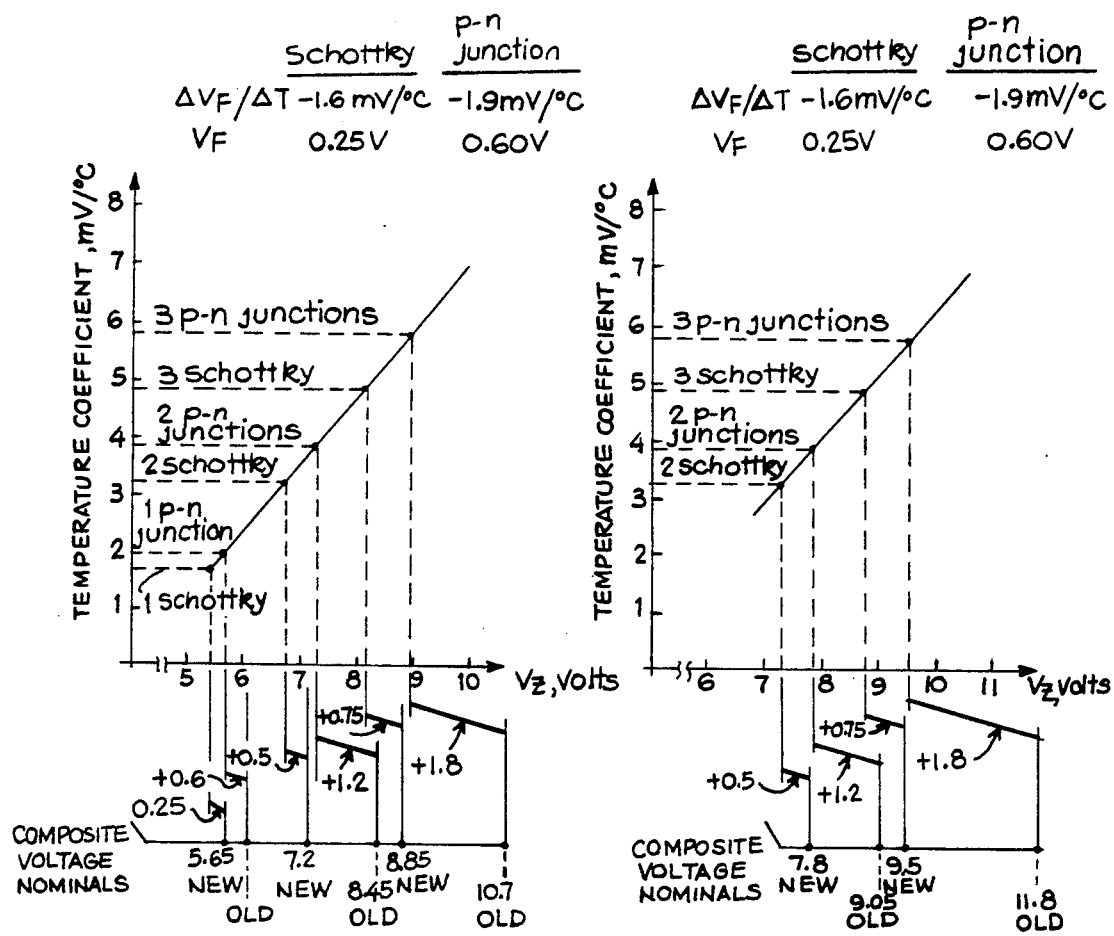
FIG. 9 illustrates the temperature coefficients judiciously matched from components having the characteristics shown in FIGS. 2, 4 and 6, wherein each data point refers to one abrupt (alloy) zener p-n junction in combination with either forward biased p-n junctions or Schottky junctions.
FIG. 10 illustrates the temperature coefficients judiciously matched from components having the characteristics shown in FIGS. 2, 4 and 6, wherein each data point refers to one graded (diffused) zener p-n junction in combination with either forward biased p-n junctions or Schottky junctions.

FIGS. 9 and 10 show the near-zero temperature coefficients derived from components having the characteristics illustrated in FIGS. 2, 4 and 6 with and without Schottky diodes. Each data point in FIG. 9 refers to one abrupt (alloy) zener p-n junction in combination with either forward biased p-n junctions or Schottky junctions, as indicated in the drawing. FIG. 10 refers to the same combinations with one graded (diffused) zener p-n junction. It is to be noted that for any given zener voltage, $V_Z$ the composite voltage nominals resulting from the use of Schottky forward elements ($V_F=0.25$ volts) is less than those obtained using the same number of p-n junction forward elements ($V_F=0.60$ volts). Thus, the new method results in a shifting of the optimum design voltages for reference diodes to lower nominal values, thus adding flexibility when required for specific applications. It is apparent that further nominal voltage options become available when using two or more forward elements in a mix of Schottky diodes and forward biased p-n junctions. Along the abscissa of each figure, the composite reference voltages for the old (forward p-n junctions) and the ne (Schottky) combinations corresponding to each zener voltage are also indicated.

As mentioned above, the judicious use of Schottky diodes in the design of zero temperature coefficient voltage reference devices by combining them with zener and forward biased p-n junctions also produces the desirable attribute of reducing standard deviations in voltage response to irradiation. This is due to the benign nature of the Schottky hot carrier when subjected to radiation, inasmuch as it portrays a negative voltage change with temperature without any significant contributing coefficient of response within the radiation spectrum of interest.

Figure 11:
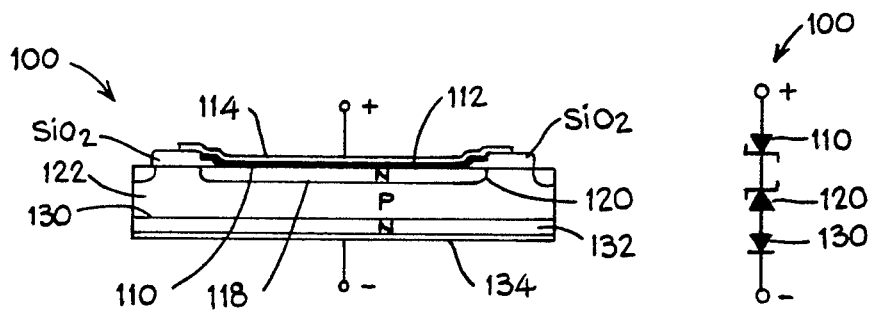
FIG. 11 illustrates one example of a monolithic structure that includes one Schottky junction in series with one zener junction and one conventional forward biased p-n junction.

An additional feature of this invention is that the Schottky forward biased diode can be integrated in series with conventional zero TC reference diodes in a single monolithic chip structure. FIG. 11 illustrates one example of many possible structures that those skilled in the art could devise to include Schottky junctions in series with a zener junction and, if desired, one or more conventional forward biased p-n junctions. As illustrated in FIG. 11, the monolithic chip 100, also shown in schematic form, consists of a series composite comprising a forward biased Schottky junction 110, a reverse biased zener junction 120 and a conventional forward biased p-n junction 130. The Schottky barrier metal 112, connected through the bondable ohmic contact metallization layer 114 to the positive terminal of a power source (not shown), forms a Schottky junction with n-doped semiconductive material 118. In turn, this is connected to p-doped semiconductive material 122 to form a reverse biased p-n junction 120, followed by another layer of n-doped semiconductive material 132 to form a forward biased p-n junction 130. Finally, the semiconductive material is connected to a load (not shown) and to the negative terminal of the power source through the ohmic contact metallization layer 134. The n region on which the Schottky barrier metal is located is determined by the desired resistivity, in a manner suitable to produce the nonlinear characteristics required to optimize the overall composite temperature and radiation response of the voltage reference device.

Various changes in the details, steps and materials that have been described may be made by those skilled in the art within the principles and scope of the invention herein illustrated and defined in the appended claims. While the present invention has been shown and described herein in what is believed to be the most practical and preferred embodiment, it is recognized that departures can be made therefrom within the scope of the invention, which is therefore not to be limited to the details disclosed herein, but is to be accorded the full scope of the claims so as to embrace any and all equivalent apparatus and methods.

I claim:

1. A voltage reference device, comprising a series combination of:
    (a) at least one forward biased Schottky junction;
    (b) at least one reverse biased p-n junction; and
    (c) at least one forward biased p-n junction.

2. The voltage reference device according to claim 1, wherein said at least one forward biased Schottky junction comprises a tungsten metal barrier bonded to gold-doped semiconductive material.

3. The voltage reference device according to claim 1, wherein said at least one forward biased Schottky junction comprises a tungsten metal barrier bonded to platinum-doped semiconductive material.

4. The voltage reference device according to claim 1, wherein said at least one forward biased Schottky junction comprises a platinum-tungsten metal barrier bonded to gold-doped semiconductive material.

5. The voltage reference device according to claim 1, wherein said at least one forward biased Schottky junction comprises a platinum-tungsten metal barrier bonded to platinum-doped semiconductive material.

6. The voltage reference device according to claim 1, wherein said at least one forward biased Schottky junction, said at least one reverse biased p-n junction, and said at least one forward biased p-n junction are implemented in monolithic structure on a semiconductor substrate.

7. The voltage reference device according to claim 6, further comprising:
    (d) an ohmic contact metallization layer bonded to the cathodic portion of said monolithic structure and an ohmic contact metallization layer bonded to the anodic portion of said monolithic structure.

8. A method for producing a voltage reference device with near-zero temperature coefficient, comprising the following steps:
    (a) combining in series at least one forward biased Schottky junction, at least one reverse biased p-n junction, and at least one forward biased p-n junction to produce a composite device; and
    (b) using the voltage produced across said composite device when a test current is passed therethrough as a voltage reference.

9. The method according to claim 8, wherein said at least one forward biased Schottky junction comprises a tungsten metal barrier bonded to gold-doped semiconductive material.

10. The method according to claim 8, wherein said at least one forward biased Schottky junction comprises a tungsten metal barrier bonded to platinum-doped semiconductive material.

11. The method according to claim 8, wherein said at least one forward biased Schottky junction comprises a platinum-tungsten metal barrier bonded to gold-doped semiconductive material.

12. The method according to claim 8, wherein said at least one forward biased Schottky junction comprises a platinum-tungsten metal barrier bonded to platinum-doped semiconductive material.

13. The method according to claim 8, wherein said at least one forward biased Schottky junction, said at least one reverse biased p-n junction, and said at least one forward biased p-n junction are implemented in monolithic structure on a semiconductor substrate.

14. The method according to claim 13, further comprising the step of:

(c) bonding an ohmic contact metallization layer to the cathodic portion of said monolithic structure and an ohmic contact metallization layer to the anodic portion of said monolithic structure.

15. The method according to claim 8, wherein said at least one forward biased Schottky junction is combined with said at least one reverse biased p-n junction and said at least one forward biased p-n junction in order to achieve a voltage reference device with near-zero radiation coefficient.

16. The method according to claim 8, wherein said at least one forward biased Schottky junction is combined with said at least one reverse biased p-n junction and said at least one forward biased p-n junction in order to lower the nominal voltage of said voltage reference device.

* * * * *